United States Patent
Ogino et al.

(10) Patent No.: US 11,183,415 B2
(45) Date of Patent: Nov. 23, 2021

(54) ADHESIVE CONTAINING POLYDIMETHYL SILOXANE

(71) Applicant: NISSAN CHEMICAL CORPORATION, Tokyo (JP)

(72) Inventors: Hiroshi Ogino, Toyama (JP); Tomoyuki Enomoto, Toyama (JP); Tetsuya Shinjo, Toyama (JP); Kazuhiro Sawada, Toyama (JP); Shunsuke Moriya, Toyama (JP)

(73) Assignee: NISSAN CHEMICAL CORPORATION, Tokyo (JP)

( * ) Notice: Subject to any disclaimer, the term of this patent is extended or adjusted under 35 U.S.C. 154(b) by 20 days.

(21) Appl. No.: 16/313,370

(22) PCT Filed: Jun. 13, 2017

(86) PCT No.: PCT/JP2017/021834
§ 371 (c)(1),
(2) Date: Dec. 26, 2018

(87) PCT Pub. No.: WO2017/221772
PCT Pub. Date: Dec. 28, 2017

(65) Prior Publication Data
US 2019/0164802 A1 May 30, 2019

(30) Foreign Application Priority Data

Jun. 22, 2016 (JP) ................................. 2016-123414

(51) Int. Cl.
| H01L 21/683 | (2006.01) |
| C09J 5/06 | (2006.01) |
| C09J 183/04 | (2006.01) |
| H01L 21/304 | (2006.01) |
| H01L 21/768 | (2006.01) |
| C09J 11/06 | (2006.01) |

(52) U.S. Cl.
CPC ........... *H01L 21/6836* (2013.01); *C09J 5/06* (2013.01); *C09J 11/06* (2013.01); *C09J 183/04* (2013.01); *H01L 21/304* (2013.01); *H01L 21/76898* (2013.01); *H01L 2221/68327* (2013.01); *H01L 2221/68386* (2013.01)

(58) Field of Classification Search
CPC ........... H01L 21/6836; H01L 21/76898; H01L 21/304; H01L 2221/68327; H01L 2221/68386; H01L 21/02013; H01L 21/02016; H01L 21/67132; H01L 21/78; C09J 11/06; C09J 5/06; C09J 183/04; C09J 2203/326
USPC .................................. 438/667, 359; 156/247
See application file for complete search history.

(56) References Cited

U.S. PATENT DOCUMENTS

| 2013/0201635 | A1* | 8/2013 | Xu ............................ B32B 7/12 361/748 |
| 2014/0000793 | A1 | 1/2014 | Takahashi et al. |
| 2014/0117504 | A1* | 5/2014 | Oliver ................. H01L 21/6835 257/618 |
| 2014/0150972 | A1 | 6/2014 | Koellnberger et al. |
| 2014/0213039 | A1* | 7/2014 | Lee ....................... H01L 21/302 438/459 |

FOREIGN PATENT DOCUMENTS

| CN | 103703088 A | 4/2014 |
| JP | 2006-508540 A | 3/2006 |
| JP | 2008-88271 A | 4/2008 |
| JP | 2008-532313 A | 8/2008 |
| JP | 2009-528688 A | 8/2009 |
| JP | 2012-510715 A | 5/2012 |
| JP | 2012-513684 A | 6/2012 |
| JP | 2013-179135 A | 9/2013 |
| JP | 2013-232459 A | 11/2013 |
| JP | 2014-146793 A | 8/2014 |
| JP | 2016-86158 A | 5/2016 |
| WO | 2015/190438 A1 | 12/2015 |

OTHER PUBLICATIONS

Aug. 29, 2017 Search Report issued in International Patent Application No. PCT/JP2017/021834.
Aug. 29, 2017 Written Opinion issued in International Patent Application No. PCT/JP2017/021834.
Jun. 4, 2020 Extended European Search Report issued in European Patent Application No. 17815241.9.
Sep. 17, 2020 Office Action issued in Taiwanese Patent Application No. 106120783.

* cited by examiner

*Primary Examiner* — Caleen O Sullivan
(74) *Attorney, Agent, or Firm* — Oliff PLC

(57) ABSTRACT

An adhesive can be easily peeled off after polishing the back face of a wafer, which has heat resistance and can be easily washed off. An adhesive for peelably adhering between a support and a circuit-bearing face of a wafer and thereby processing a back face of the wafer, a peeling face upon peeling becomes selectable according to heating from the support side or wafer side when the adhesive is cured. The adhesive includes a component (A) curing by hydrosilylation reaction and a component (B) containing a polydimethylsiloxane. A peeling method including forming an adhesion layer by applying the adhesive to a surface of a first substrate, bonding a surface of a second substrate to the adhesion layer, curing the adhesion layer by heating from the first substrate side to form a laminate, processing the laminate, and peeling off between the first substrate and the adhesion layer.

18 Claims, No Drawings

ADHESIVE CONTAINING POLYDIMETHYL SILOXANE

TECHNICAL FIELD

The present invention relates to an adhesive for fixing a wafer to a support during polishing of the back face of the wafer and a laminate prepared by using the adhesive.

BACKGROUND ART

In semiconductor wafers that have been integrated in a two-dimensional plane direction, there is a demand for a semiconductor integration technique that integrates (laminates) planes further in three dimensions in order to further integrate them. This three-dimensional laminating is a technique of integrating in multiple layers while connecting by TSV (through silicon via). When integrating in multiple layers, each semiconductor wafer to be integrated is thinned by polishing the opposite side (that is, back face) to the face of the wafer on which a circuit is formed, and the thinned semiconductor wafers are laminated.

A semiconductor wafer before thinning (also simply referred to as wafer here) is adhered to a support for polishing with a polishing apparatus. The adhesion at that time is called temporary adhesion because it must be easily peeled off after polishing. When a large force is applied for detachment, the thinned semiconductor wafer may be cut or deformed, and it is required to be easily removed by temporary adhesion so as not to cause such a situation. However, it is not preferable that the semiconductor wafer is detached or shifted from the support due to polishing stress when polishing the back face of the semiconductor wafer. Therefore, the performance required for temporary adhesion is to withstand the stress at the time of polishing and to be easily removed after polishing.

For example, it is required to have a high stress (strong adhesive force) to the planar direction during polishing and a low stress (weak adhesive force) to the longitudinal direction at the time of detachment.

As such adhesion processes, the following methods are disclosed: a method in which an adhesion layer and a separation layer are provided, the separation layer is formed by plasma polymerization of dimethylsiloxane, and the adhesion layer and the separation layer are mechanically separated after polishing (see Patent Documents 1 and 2); a method in which a support substrate and a semiconductor wafer are adhered with an adhesive composition, the back face of the semiconductor wafer is polished and then the adhesive is removed with an etching solution (See Patent Document 3); and a method for forming a wafer processed body in which an adhesion layer for adhering a support and a semiconductor wafer is a combination of a polymerized layer obtained by polymerizing an alkenyl group-containing organopolysiloxane and a hydrosilyl group-containing organopolysiloxane with a platinum catalyst and a polymerized layer comprising a thermosetting polysiloxane (see Patent Document 4, Patent Document 5, Patent Reference 6, Patent Document 7).

RELATED-ART DOCUMENTS

Patent Documents

[Patent Document 1] JP 2012-510715 A
[Patent Document 2] JP 2012-513684 A
[Patent Document 3] JP 2008-532313 A
[Patent Document 4] JP 2013-179135 A
[Patent Document 5] JP 2013-232459 A
[Patent Document 6] JP 2006-508540 A
[Patent Document 7] JP 2009-528688 A

SUMMARY OF THE INVENTION

Problem to be Solved by the Invention

The present invention provides an adhesive for forming an adhesion layer between a support (support substrate) and a wafer, wherein the adhesive comprises a polyorganosiloxane component curing by hydrosilylation reaction and a non-reactive polyorganosiloxane component, withstands a stress at the time of polishing the back face of the wafer and can be easily removed after polishing, and enables selection of a peeled surface depending on the heating direction at the time of curing with heating.

Means for Solving the Problem

The present invention provides, as a first aspect, an adhesive for peelably adhering between a support and a circuit-bearing face of a wafer and thereby processing a back face of the wafer, a peeling face upon peeling becomes controllable according to heating from the support side or heating from the wafer side when the adhesive is cured.

The present invention provides, as a second aspect, an adhesive for bonding a surface of a support and a circuit-bearing face of a wafer surface, enabling a temporal adhesion for processing a back face of the wafer, and enabling a selection of a peeling face between the support and the adhesive or between the wafer and the adhesive according to heating and curing from the support side or from the wafer side, wherein the adhesive comprises a component (A) curing by hydrosilylation reaction and a component (B) containing a polydimethylsiloxane.

The present invention provides, as a third aspect, the adhesive according to the second aspect, wherein the component (A) contains a polysiloxane (A1) selected from the group consisting of a siloxane unit (Q unit) represented by $SiO_2$, a siloxane unit (M unit) represented by $R^1R^2R^3SiO_{1/2}$, a siloxane unit (D unit) represented by $R^4R^5SiO_{2/2}$, a siloxane units (T unit) represented by $R^6SiO_{3/2}$, and a combination thereof (wherein $R^1$ to $R^6$ independently of one another are a mono-valent chemical group which is a $C_{1-10}$ alkyl group, a $C_{2-10}$ alkenyl group, or a hydrogen atom, with a proviso that each of $R^1$ to $R^6$ is bonded to a silicon atom through Si—C bond or Si—H bond), and a platinum group metal-based catalyst (A2), wherein the polysiloxane (A1) contains a polyorganosiloxane (a1) (the polyorganosiloxane (a1) is selected from the group consisting of a siloxane unit (Q unit) represented by $SiO_2$, a siloxane unit (M' unit) represented by $R^{1'}R^{2'}R^{3'}SiO_{1/2}$, a siloxane unit (D' unit) represented by $R^{4'}R^{5'}SiO_{2/2}$, a siloxane units (T' unit) represented by $R^{6'}SiO_{3/2}$, and a combination thereof (wherein $R^{1'}$ to $R^{6'}$ independently of one another are a mono-valent chemical group which is a $C_{1-10}$ alkyl group, or a $C_{2-10}$ alkenyl group), and a polyorganosiloxane (a2) (the polyorganosiloxane (a2) is selected from the group consisting of a siloxane unit (Q unit) represented by $SiO_{1/2}$, a siloxane unit (M'' unit) represented by $R^{1''}R^{2''}R^{3''}SiO_{1/2}$, a siloxane unit (D'' unit) represented by $R^{4''}R^{5''}SiO_{2/2}$, a siloxane units (T'' unit) represented by $R^{6''}SiO_{3/2}$, and a combination thereof (wherein $R^{1''}$ to $R^{6''}$ independently of one another are a mono-valent chemical group which is a $C_{1-10}$ alkyl group, or a hydrogen atom).

The present invention provides, as a fourth aspect, the adhesive according to the second or third aspect, wherein the component (B) is a polydimethylsiloxane having a viscosity of 1,100 mm$^2$/s to 2,000,000 mm$^2$/s.

The present invention provides, as a fifth aspect, the adhesive according to the second or third aspect, wherein the component (B) is a polydimethylsiloxane having a viscosity of 10,000 mm$^2$/s to 1,000,000 mm$^2$/s.

The present invention provides, as a sixth aspect, the adhesive according to any one of the second aspect to the fifth aspect, wherein the component (A) and the component (B) is contained in a ratio of 80:20 to 50:50 in % by mass in the adhesive.

The present invention provides, as a seventh aspect, the adhesive according to any one of the second aspect to the sixth aspect, further comprising an inhibitor (A3).

The present invention provides, as an eighth aspect, the adhesive according to any one of the first aspect to the seventh aspect, wherein the processing is a polishing of the back face of the wafer.

The present invention provides, as a ninth aspect, a forming method of a laminate comprising the steps:
a first step of forming an adhesion layer by applying the adhesive according to any one of the first aspect to the eighth aspect to a surface of a first substrate;
a second step of bonding a surface of a second substrate to the adhesion layer; and
a third step of curing the adhesion layer by heating from the first substrate side.

The present invention provides, as a tenth aspect, the forming method according to the ninth aspect, wherein the first substrate is a support, the second substrate is a wafer, a circuit-bearing face of the wafer faces the first substrate in the second step.

The present invention provides, as an eleventh aspect, the forming method according to the ninth aspect, wherein the first substrate is a wafer, the second substrate is a support, a circuit-bearing face of the wafer faces the second substrate in the second step.

The present invention provides, as a twelfth aspect, the forming method according to any one of the ninth aspect to the eleventh aspect, wherein the heating in the third step is carried out at 120 to 260° C. with a hot plate.

The present invention provides, as a thirteenth aspect, a peeling method comprising the steps:
a first step of forming an adhesion layer by applying the adhesive according to any one of the first aspect to the eighth aspect to a surface of a first substrate;
a second step of bonding a surface of a second substrate to the adhesion layer;
a third step of curing the adhesion layer by heating from the first substrate side to form a laminate;
a fourth step of processing the laminate; and
a fifth step of peeling off between the first substrate and the cured adhesion layer.

The present invention provides, as a fourteenth aspect, the peeling method according to the thirteenth, wherein the first substrate is a support, the second substrate is a wafer, a circuit-bearing face of the wafer faces the first substrate in the second step.

The present invention provides, as a fifteenth aspect, the peeling method according to the thirteenth aspect, wherein the first substrate is a wafer, the second substrate is a support, a circuit-bearing face of the wafer faces the second substrate in the second step.

The present invention provides, as a sixteenth aspect, the peeling method according to the thirteenth aspect, wherein the heating in the third step is carried out with a hot plate, a temperature of the first substrate is 120 to 260° C., and a temperature difference between the first substrate and the second substrate is 2 to 20° C.

The present invention provides, as a seventeenth aspect, the peeling method according to any one of the thirteenth aspect to the sixteenth aspect, wherein the processing in the fourth step is a polishing of a back face of the first substrate or the second substrate.

The present invention provides, as an eighteenth aspect, the peeling method according to any one of the thirteenth aspect to the seventeenth aspect, wherein after peeling off between the first substrate and the adhesion layer, the second substrate and the adhesion layer are further separated.

The present invention provides, as a nineteenth aspect, the peeling method according to the eighteenth aspect, wherein the separation of the second substrate and the adhesion layer is carried out by adhering a tape to a surface of the adhesive and peeling off at an angle of 60° to 180° to a face of the second substrate.

The present invention provides, as a twentieth aspect, a processing method of a laminate comprising the steps:
forming an adhesion layer by applying an adhesive to a surface of a first substrate according to the method of any one of the ninth aspect to the twentieth aspect;
bonding a surface of a second substrate to the adhesion layer; and
polishing a back face of the first substrate or the second substrate and then peeling off between the first substrate and the adhesion layer according to the method of any one of the thirteenth aspect to the nineteenth aspect.

Effects of the Invention

The present invention exerts the following effects by that the adhesive inserted between a support and a circuit-bearing face of a wafer comprises a component (A) cross-linking curing by hydrosilylation reaction and a component (B) containing a non-crosslinkable polydimethylsiloxane, a laminate for processing a back face of a wafer opposite to a circuit-bearing face of the wafer is formed, polysiloxanes of specific components are combined: it is excellent in spin-coatability to a circuit-bearing face of a wafer or a support, it is excellent in heat resistance when bonding a substrate surface and a circuit-bearing face of a wafer or processing a back face of a wafer, it can be easily peeled off after processing a back face of a wafer, that is, after polishing, the adhesive adhered on a wafer or a support after the peeling off can be easily removed by peeling off with a solvent or a tape.

In addition, the adhesive of the present invention can be peeled off selectively from the direction heated at the time of curing the adhesion layer obtained by applying the adhesive when the wafer and the support are separated after processing the back face (opposite side to circuit-bearing face) of the wafer. That is, in a case where a laminate comprising a wafer, an adhesion layer and a support is cured with heating from the wafer side on curing of the adhesion layer, the laminate can be peeled off between the wafer and the adhesion layer on peeling off. In addition, in a case where a laminate is cured with heating from the support side on curing of the adhesion layer, the laminate can be peeled off between the support and the adhesion layer on peeling off. That is, the adhesive of the present invention exerts an effect that a peeling face can be selected depending on heating from the support side or wafer side on curing of the adhesion layer obtained by applying the adhesive.

As the adhesive of the present invention comprises two kinds of polyorganosiloxanes which are a component (A) curing by hydrosilylation reaction and a component (B) containing a polydimethylsiloxane, distribution difference of each component is generated in the adhesion layer and therefore it enables the control of the peeling face. The adhesive of the present invention may further comprise other polyorganosiloxanes in addition to component (A) and component (B).

In processing of the opposite side to the circuit-bearing face of the wafer, thinning of the wafer by polishing is performed. Thereafter, a through silicon via (TSV) or the like is formed, and then the thinned wafer is peeled off from the support to form a laminate of wafers, which is mounted three-dimensionally. In addition, wafer backside electrodes and the like are formed before and after that. In the thinning of the wafer and the TSV process, heat of 250 to 350° C. is applied in a state of being adhered to the support, but the laminate in which the adhesive of the present invention is used has a resistance to such a heat.

MODES FOR CARRYING OUT THE INVENTION

The present invention relates to an adhesive for peelably adhering between a support and a circuit-bearing face of a wafer and thereby processing a back face of the wafer, wherein the adhesive comprises a component (A) curing by hydrosilylation reaction and a component (B) containing a polydimethylsiloxane.

The present invention also relates to an adhesive for peelably adhering between a support and a circuit-bearing face of a wafer and thereby processing a back face of the wafer, a peeling face upon peeling becomes selectable according to heating from the support side or heating from the wafer side when the adhesive is cured.

The phrase "a peeling face upon peeling becomes selectable (controllable)" means that in a case where a laminate comprising a wafer, an adhesion layer and a support is cured with heating from the wafer side on curing of the adhesion layer, the laminate can be preferentially peeled off between the wafer and the adhesion layer on peeling off, or in a case where a laminate is cured with heating from the support side on curing of the adhesion layer, the laminate can be preferentially peeled off between the support and the adhesion layer on peeling off. That is, the phrase "a peeling face upon peeling becomes selectable" means that a peeling at the interface between heated side (support or wafer) and the adhesion layer becomes possible. Here, "peeling becomes possible" or "peelable" exhibits that it has a low peel strength compared to other peeling parts and thereby it is liable to be peeled. For example, a wafer is placed on a coater with the wafer on the back face thereof facing down, the adhesive is applied on the circuit-bearing face by a spin-coating to form an adhesion layer, a support is placed on the adhesion layer, and the back face of the wafer is heated with a hot plate to cure the adhesion layer and form a laminate, and then the back face of the wafer is processed (polished). Thereafter, when the wafer is removed from the laminate, a force required for peeling between the wafer and the adhesion layer is lower than a force required for peeling between the substrate and the adhesion layer, and thus preferential peel between the wafer and the adhesion layer becomes possible.

In addition, the adhesive is an adhesive comprising a component (A) curing by hydrosilylation reaction and a component (B) containing a polydimethylsiloxane.

In the present invention, a support and a wafer are temporarily adhered by the adhesive, and the back face opposite to the circuit-bearing face of the wafer is processed by polishing or the like, whereby the thickness of the wafer can be reduced.

The temporary adhesion makes possible that the support and the wafer are adhered at the time of polishing the back face of the wafer, and after the polishing of the back surface of the wafer, the thinned wafer can be separated from the support.

In the present invention, an adhesion layer is formed from the adhesive. The adhesive comprises a component (A) and a component (B), and may further comprise other additives.

The component (A) contains a polysiloxane (A1) selected from the group consisting of a siloxane unit (Q unit) represented by $SiO_2$, a siloxane unit (M unit) represented by $R^1R^2R^3SiO_{1/2}$, a siloxane unit (D unit) represented by $R^4R^5SiO_{2/2}$, a siloxane units (T unit) represented by $R^6SiO_{3/2}$, and a combination thereof (wherein $R^1$ to $R^6$ independently of one another are a mono-valent chemical group which is a $C_{1-10}$ alkyl group, a $C_{2-10}$ alkenyl group, or a hydrogen atom, with a proviso that each of $R^1$ to $R^6$ is bonded to a silicon atom through Si—C bond or Si—H bond), and a platinum group metal-based catalyst (A2), the polysiloxane (A1) contains a polyorganosiloxane (a1) and a polyorganosiloxane (a2).

The polyorganosiloxane (a1) is composed of siloxane units having a $C_{1-10}$ alkyl group and a $C_{2-10}$ alkenyl group as substituents, and the polyorganosiloxane (a2) is composed of siloxane units having a $C_{1-10}$ alkyl group and a hydrogen atom as substituents. The adhesive cures by forming a cross-link structure by hydrosilylation reaction of the alkenyl group and the SiH group in the presence of the platinum group metal-based catalyst (A2).

The polyorganosiloxane (a1) is selected from the group consisting of a siloxane unit (Q unit) represented by $SiO_2$, a siloxane unit (M' unit) represented by $R^1R^2R^3{}'SiO_{1/2}$, a siloxane unit (D' unit) represented by $R^4R^5{}'SiO_{2/2}$, a siloxane units (T' unit) represented by $R^6{}'SiO_{3/2}$, and a combination thereof. For example, the polyorganosiloxane (a1) is formed from a combination of (Q unit and M' unit) and (D' unit and M' unit), a combination of (T' unit and M' unit) and (D' unit and M' unit), a combination of (Q unit, T' unit and M' unit) and (T' unit and M' unit), a combination of (T' unit and M' unit), or a combination of (Q unit and M' unit), The polyorganosiloxane (a2) is selected from the group consisting of a siloxane unit (Q unit) represented by $SiO_2$, a siloxane unit (M" unit) represented by $R^{1''}R^{2''}R^{3''}SiO_{1/2}$, a siloxane unit (D" unit) represented by $R^{4''}R^{5''}SiO_{2/2}$, a siloxane units (T" unit) represented by $R^{6''}SiO_{3/2}$, and a combination thereof. For example, the polyorganosiloxane (a2) is formed from a combination of (M" unit and D" unit), a combination of (Q unit and M" unit), or a combination of (Q unit, T" unit and M" unit).

The $C_{2-10}$ alkenyl group includes for example ethenyl group, 1-propenyl group, 2-propenyl group, 1-methyl-1-ethenyl group, 1-butenyl group, 2-butenyl group, 3-butenyl group, 2-methyl-1-propenyl group, 2-methyl-2-propenyl group, 1-ethylethenyl group, 1-methyl-1-propenyl group, 1-methyl-2-propenyl group, 1-pentenyl group, 2-pentenyl group, 3-pentenyl group, 4-pentenyl group, 1-n-propylethenyl group, 1-methyl-1-butenyl group, 1-methyl-2-butenyl group, 1-methyl-3-butenyl group, 2-ethyl-2-propenyl group, 2-methyl-1-butenyl group, 2-methyl-2-butenyl group, 2-methyl-3-butenyl group, 3-methyl-1-butenyl group, 3-methyl-2-butenyl group, 3-methyl-3-butenyl group, 1,1- dimethyl-2-propenyl group, 1-i-propylethenyl group, 1,2-dimethyl-1-propenyl group, 1,2-dimethyl-2-propenyl group, 1-hexenyl group, 2-hexenyl group, 3-hexenyl group, 4-hexenyl group, 5-hexenyl group, 1-methyl-1-pentenyl, 1-methyl-2-pentenyl, 1-methyl-3-pentenyl, 1-methyl-4-pentenyl, 1-n-butylethenyl group, 2-methyl-1-pentenyl group, 2-methyl-2-pentenyl group, 2-methyl-3-pentenyl group, 2-methyl-4-pentenyl group, 2-n-propyl-2-propenyl group, 3-methyl-1-pentenyl group, 3-methyl-2-pentenyl group, 3-methyl-3-pentenyl group, 3-methyl-4-pentenyl group, 3-ethyl-3-butenyl group, 4-methyl-1-pentenyl group, 4-methyl-2-pentenyl group, 4-methyl-3-pentenyl group, 4-methyl-4-pentenyl group, 1,1-dimethyl-2-butenyl group, 1,1-dimethyl-3-butenyl group, 1,2-dimethyl-1-butenyl group, 1,2-dimethyl-2-butenyl group, 1,2-dimethyl-3-butenyl group, 1-methyl-2-ethyl-2-propenyl group, 1-s-butylethenyl group, 1,3-dimethyl-1-butenyl group, 1,3-dimethyl-2-butenyl group, 1,3-dimethyl-3-butenyl group, 1-i-butylethenyl group, 2,2-dimethyl-3-butenyl group, 2,3-dimethyl-1-butenyl group, 2,3-dimethyl-2-butenyl group, 2,3-dimethyl-3-butenyl group, 2-i-propyl-2-propenyl group, 3,3-dimethyl-1-butenyl group, 1-ethyl-1-butenyl group, 1-ethyl-2-butenyl group, 1-ethyl-1-butenyl group, 2-ethyl-2-butenyl group, 2-ethyl-3-butenyl group, 1,1,2-trimethyl-2-propenyl group, 1-t-butylethenyl group, 1-methyl-1-ethyl-2-propenyl group, 1-ethyl-2-methyl-1-propenyl group, 1-ethyl-2-methyl-2-propenyl group, 1-i-propyl-1-propenyl group and 1-i-propyl-2-propenyl group, and the like. Particularly, ethenyl group, that is, vinyl group, and 2-propenyl group, that is allyl group are preferably used.

The $C_{1-10}$ alkyl group includes for example methyl group, ethyl group, n-propyl group, i-propyl group, n-butyl group, i-butyl group, s-butyl group, t-butyl group, n-pentyl group, 1-methyl-n-butyl group, 2-methyl-n-butyl group, 3-methyl-n-butyl group, 1,1-dimethyl-n-propyl group, 1,2-dimethyl-n-propyl group, 2,2-dimethyl-n-propyl group, 1-ethyl-n-propyl group, n-hexyl group, 1-methyl-n-pentyl group, 2-methyl-n-pentyl group, 3-methyl-n-pentyl group, 4-methyl-n-pentyl group, 1,1-dimethyl-n-butyl group, 1,2-dimethyl-n-butyl group, 1,3-dimethyl-n-butyl group, 2,2-dimethyl-n-butyl group, 2,3-dimethyl-n-butyl group, 3,3-dimethyl-n-butyl group, 1-ethyl-n-butyl group, 2-ethyl-n-butyl group, 1,1,2-trimethyl-n-propyl group, 1,2,2-trimethyl-n-propyl group, 1-ethyl-1-methyl-n-propyl group, and 1-ethyl-2-methyl-n-propyl group, and the like. Particularly, methyl group is preferably used.

The polyorganosiloxane (a1) is composed of siloxane units having a $C_{1-10}$ alkyl group and a $C_{2-10}$ alkenyl group as substituents, and the polyorganosiloxane (a1) in which the $C_{1-10}$ alkyl group is methyl group and the $C_{2-10}$ alkenyl group is ethenyl group, that is, vinyl group, the ratio of the alkenyl groups $R^{1'}$ to $R^{6'}$ in all substituents is 0.1 mol % to 50.0 mol %, preferably 0.5 mol % to 30.0 mol %, and the reminders of $R^{1'}$ to $R^{6'}$ are alkyl groups may be used.

In addition, the polyorganosiloxane (a2) is composed of siloxane units having a $C_{1-10}$ alkyl group and a hydrogen atom as substituents, and the polyorganosiloxane (a2) in which the $C_{1-10}$ alkyl group is methyl group and the hydrogen atom form Si—H structure, the ratio of $R^{1'''}$ to $R^{6'''}$ forming the Si—H structure in all substituents is 0.1 mol % to 50.0 mol %, preferably 10.0 mol % to 40.0 mol %, and the reminders of $R^{1'''}$ to $R^{6'''}$ are alkyl groups may be used.

The polyorganosiloxane (a1) and the polyorganosiloxane (a2) may include alkenyl group and hydrogen atom represented by Si—H group in a range of a molar ratio of 2.0:1.0, preferably 1.5:1.0.

The polyorganosiloxane (a1) and the polyorganosiloxane (a2) which can be used have a weight average molecular weight of 500 to 1,000,000, or 5,000 to 50,000, respectively. These molecular weights correspond to molecular weights obtained by polystyrene conversion with GPC analysis. The polyorganosiloxane (a1) and the polyorganosiloxane (a2) which can be used have a viscosity of 10 mPa·s to 1,000,000 mPa·s, preferably 10 mPa·s to 100,000 mPa·s, more preferably 10 mPa·s to 10,000 mPa·s. These viscosities are determined by measuring with E-type rotational viscometer at 25° C.

The component (A) comprises a platinum group metal-based catalyst (A2). The platinum group metal-based catalyst is a catalyst for accelerating the hydrosilylation addition reaction of an alkenyl group and a Si—H group, and platinum black, platinum (IV) chloride, chloroplatinic acid, a reacted product of chloroplatinic acid and a mono-valent alcohol, a complex of chloroplatinic acid and an olefin, a platinum bisacetoacetate, and the like are used. The omplex of chloroplatinic acid and an olefin includes for example a complex of divinyltetramethyldisiloxane and platinum. The addition amount of the platinum catalyst is a range of 1.0 to 500.0 ppm, preferably 1.0 to 50.0 ppm as platinum metal based on the total amount of the polyorganosiloxane (a1) and the polyorganosiloxane (a2).

The component (A) can contain further an alkynyl alcohol as an inhibitor (A3) for suppressing the progress of hydrosylation reaction. The inhibitor includes for example 1-ethynyl-1-cyclohexanol and the like. The inhibitor can be added in a range of 500.0 to 100,000.0 ppm, preferably 1,000.0 to 10,000.0 ppm based on the total amount of the polyorganosiloxane (a1) and the polyorganosiloxane (a2).

The polyorganosiloxane used for the component (B) of the present invention contains a siloxane unit (D unit) represented by $RRSiO_{2/2}$ (with a proviso that each is bonded to a silicon atom through Si—C bond), in which R is a $C_{1-10}$ alkyl group which includes those exemplified above, and is preferably methyl group, and includes polydimethylsiloxane.

The polysiloxane used for the component (B) contains a siloxane unit (D unit), and may contain Q unit, M unit, and T unit. For example, a case consisting of only D unit, a case of a combination of D unit and Q unit, a case of a combination of D unit and M unit, a case of a combination of D unit and T unit, a case of a combination of D unit, Q unit and M unit, a case of a combination of D unit, M unit and T unit, a case of a combination of D unit, Q unit, M unit and T unit, and the like are mentioned.

The component (B) may be a polydimethylsiloxane having a viscosity of 1,100 $mm^2/s$ to 2,000,000 $mm^2/s$, preferably 10,000 $mm^2/s$ to 1,000,000 $mm^2/s$. The component (B) is a dimethyl silicone oil comprising polydimethylsiloxane. The value of the above-mentioned viscosity is indicated by kinematic viscosity, and the unit thereof centistokes (cSt) =$mm^2/s$. The kinematic viscosity can be measured with a kinematic viscosity meter. In addition, the kinematic viscosity can be calculated by dividing a viscosity (mPa·s) with a density (g/$cm^3$). That is, the kinematic viscosity can be determined from a viscosity measured with E-type rotational viscometer at 25° C. and a density, and it can be calculated from "kinematic viscosity ($mm^2/s$)=viscosity (mPa·s)/density (g/$cm^3$)".

In the present invention, the component (A) and the component (B) in the adhesive can be used in an arbitrary ratio.

In adhesiveness, the component (A) and the component (B) in the adhesive can be used in an arbitrary ratio. In order to improve further peelability, the ratio of the component (A) and the component (B) in the adhesive can be 80:20 to 20:80 in % by mass. Further, in a case where peeling face is controlled, the ratio of the component (A) and the component (B) in the adhesive is preferably 80:20 to 50:50 in % by mass.

The present invention includes a forming method of a laminate comprising the steps:

a first step of forming an adhesion layer by applying the above-mentioned adhesive to a surface of a first substrate;

a second step of bonding a surface of a second substrate to the adhesion layer; and a third step of curing the adhesion layer by heating from the first substrate side. The adhesive cures by the heating.

The present invention includes also the forming method wherein the first substrate is a support, the second substrate is a wafer, a circuit-bearing face of the wafer faces the first substrate in the second step.

In addition, the present invention includes the forming method wherein the first substrate is a wafer, the second substrate is a support, a circuit-bearing face of the wafer faces the second substrate in the second step.

The wafer includes for example a silicon wafer having a diameter of about 300 mm and a thickness of about 770 μm.

The support (carrier) includes for example a glass wafer or a silicon wafer which has a diameter of about 300 mm and a thickness of about 770 μm.

For example, a laminate can be formed by attaching the adhesive to the surface of a support with a spin coater to form an adhesion layer, bonding the surface of the support and the circuit-bearing face of the wafer surface so as to sandwich the adhesive, and heating at a temperature of 120 to 260° C. to cure the adhesive.

In addition, a laminate can be formed by attaching the adhesive to the circuit-bearing face on the surface of a wafer with the back face of the wafer facing down with a spin coater to form an adhesion layer, bonding a support so as to sandwich the adhesive, and heating at a temperature of 120 to 260° C. to cure the adhesive. The curing of the adhesive starts from a heating temperature of about 120° C., and it is possible to heat at a temperature of 260° C. or more, but from the viewpoint of the heat resistance of the circuit-bearing face (device face) of the wafer, the temperature is preferably 260° C. or less, more preferably about 150° C. to about 230° C., further preferably about 190° C. to about 200° C. The heating time is preferably, for example, 1 minute to 30 minutes, 3 minutes or more from the viewpoint of the degree of processing of the adhesive curing, and 10 minutes or less from the viewpoint of throughput.

In addition, the adhesive can include a solvent for controlling viscosity. The solvent includes for example hydrocarbons such as isoparaffin, p-methane, hexane, undecane or the like, aromatic hydrocarbons such as toluene, mesitylene, p-cymene or the like, esters such as butyl acetate or the like, halogen solvents such as chloroform or the like. The solvent can be added in an arbitrary ratio based on the amount of adhesive.

The heating can be carried out from either side of the first substrate or the second substrate with a hot plate.

The laminate can be formed by combining the support and the wafer formed so as to sandwich the adhesive under a reduced pressure (for example in a reduced state of 10 Pa to 10,000 Pa). When the support and the wafer are combined, only the face facing down can be heated under a reduced pressure, and the heating can be carried out for example at 120 to 260° C. The adhesion layer cures by the heating.

The present invention includes a peeling method comprising the steps:

a first step of forming an adhesion layer by applying the adhesive to a surface of a first substrate;

a second step of bonding a surface of a second substrate to the adhesion layer;

a third step of curing the adhesion layer by heating from the first substrate side to form a laminate;

a fourth step of processing the laminate; and a fifth step of peeling off between the first substrate and the cured adhesion layer.

The present invention includes also the peeling method wherein the first substrate is a support, the second substrate is a wafer, a circuit-bearing face of the wafer faces the first substrate in the second step.

In addition, the present invention includes the peeling method wherein the first substrate is a wafer, the second substrate is a support, a circuit-bearing face of the wafer faces the second substrate in the second step.

It is able to set the thickness of the adhesion layer obtained by applying the adhesive to 5 to 500 μm, preferably 10 to 200 μm, more preferably 20 to 150 μm, further preferably 30 to 120 μm, and particularly preferably 30 to 70 μm.

In order to make selection of peeling face, the heating can be carried out from the first substrate side with a hot plate so that a temperature of the first substrate is 120 to 260° C., and a temperature difference between the first substrate and the second substrate is 2 to 20° C., preferably 2 to 10° C., more preferably 3 to 8° C. As the first substrate faces the surface of the hot plate, the temperature on the hot plate is considered to be the temperature of the first substrate. The temperature of the second substrate is lower than the temperature of the first substrate within the above-mentioned temperature difference range. The reason for the temperature difference is that due to heating from the first substrate side, a temperature difference due to thermal conduction occurs at the time of curing of the adhesive in the laminate including the first substrate, the adhesive, and the second substrate. This temperature difference causes deviation of the distribution of the components, which makes it possible to select the peeling face at the time of peeling. The hot plate is a contact heating apparatus such as a heater and the like and can be used as long as it is a heating apparatus having such a function.

Processing on the opposite side of the circuit-bearing face of the wafer includes thinning the wafer by polishing. Thereafter, a through silicon via (TSV) or the like is formed, and then the thinned wafer is peeled off from the support to form a laminate of wafers, which is mounted three-dimensionally. In addition, wafer backside electrodes and the like are formed before and after that. In the thinning of the wafer and the TSV process, heat of 250 to 350° C. is applied in a state where it is adhered to the support, but the laminate comprising the wafer, the adhesive layer and the support of the present invention has a resistance to the above-mentioned heat.

For example, a wafer having a diameter of about 300 mm and a thickness of about 770 μm can be thinned to a thickness of about 80 μm to 4 μm by polishing the face opposite to the circuit-bearing face.

After adhering and processing (polishing) the back face, the support and the wafer are separated. Peeling methods include solvent peeling, laser peeling, mechanical peeling with a machine having a sharp portion, peeling off between the support and the wafer, and the like.

After the above-mentioned peeling, the adhesive hardly adheres to the first substrate side, but it is possible to clean the first substrate face with a cleaner such as a solvent or the like. The cleaner which can be used includes for example a cleaner liquid containing a fluoride salt such as quaternary ammonium fluoride or the like, an organic base such as diazabicycloundecene or the like, and an organic solvent.

Also, after the above-mentioned peeling, the adhesive remains on the second substrate side, and separation of the second substrate and the adhesive is performed in order to regenerate the second substrate. In a case where the second substrate is a support, the adhesive is separated in order to regenerate the support. For separation of the adhesive, separation by a solvent, peeling method by a tape, or the like is used. A separation of the second substrate and the adhesive can be carried out for example a tape peeling method by attaching a commercially available tape to the adhesive surface on the second substrate, peeling off at an angle of 60° (degrees) to 180° with respect to the second substrate surface to separate the second substrate and the adhesive.

The present invention relates to a processing method of a laminate comprising bonding according to the above-mentioned method, polishing the back face of the wafer, and then peeling by the above method.

EXAMPLES

Preparation of Component (A) of Adhesive 22.49 kg of a base polymer (manufactured by Wacker Chemie AG) consisting of a vinyl group-containing linear polydimethylsiloxane having a viscosity of 200 mPa·s and a vinyl group-containing MQ resin as polysiloxane (a1), 1.46 kg of a Si—H group-containing linear polydimethylsiloxane having a viscosity of 70 mPa·s (manufactured by Wacker Chemie AG) as polysiloxane (a2), 0.63 kg of a SiH group-containing linear polydimethylsiloxane having a viscosity of 100 mPa·s (manufactured by Wacker Chemie AG) as polysiloxane (a2), and 63.5 g of 1-ethynylcyclohexanol (manufactured by Wacker Chemie AG) as (A3) were stirred with a stirrer (a planetary mixer manufactured by Inoue Mfg., Inc.) for 40 minutes (referred to as mixture 1). Separately, 30.4 g of a platinum catalyst (manufactured by Wacker Chemie AG) as (A2) and 1.05 kg of a vinyl group-containing linear polydimethylsiloxane (manufactured by Wacker Chemie AG) having a viscosity of 1,000 mPa·s as polysiloxane (a2) were stirred with a three-one motor (manufactured by Shinto Scientific Co., Ltd.) for 30 minutes (referred to as mixture 2). 0.98 kg of the mixture 2 was added to the mixture 1, and further stirred for 40 minutes to obtain a mixture. Finally, the mixture was filtered through a 5 μm PP (polypropylene) filter to obtain a component (A) of an adhesive.

Polydimethylsiloxane was prepared as a component (B) of the adhesive.

(Adhesive 1)

To 100 parts by mass of a mixture consisting of 99% by mass (ratio of component (A) in component (A) and component (B)) of component (A) polyorganosiloxane and 1% by mass (ratio of component (B) in component (A) and component (B)) of component (B) polyorganosiloxane (manufactured by Wacker Chemie AG, trade name: AK1000000, viscosity: 1,000,000 mm$^2$/s), 1.5 parts by mass of an isoparaffin-based solvent (trade name: Isoper-E, manufactured by Andoh Parachemie Co., Ltd., hereinafter referred to "Isoper-E") as a solvent was added, and mixed with a planetary centrifugal mixer (manufactured by Thinky Corporation, trade name: ARE-500) for 5 minutes to produce Adhesive 1.

(Adhesive 2)

To 100 parts by mass of a mixture consisting of 90% by mass (ratio of component (A) in component (A) and component (B)) of component (A) polyorganosiloxane and 10% by mass (ratio of component (B) in component (A) and component (B)) of component (B) polyorganosiloxane (manufactured by Wacker Chemie AG, trade name: AK1000000, viscosity: 1,000,000 mm$^2$/s), 15 parts by mass of Isoper-E (manufactured by Andoh Parachemie Co., Ltd.) as a solvent was added, and mixed with a planetary centrifugal mixer (manufactured by Thinky Corporation, trade name: ARE-500) for 5 minutes to produce Adhesive 2.

(Adhesive 3)

To 100 parts by mass of a mixture consisting of 85% by mass (ratio of component (A) in component (A) and component (B)) of component (A) polyorganosiloxane and 15% by mass (ratio of component (B) in component (A) and component (B)) of component (B) polyorganosiloxane (manufactured by Wacker Chemie AG, trade name: AK1000000, viscosity: 1,000,000 mm$^2$/s), 22.5 parts by mass of Isoper-E (manufactured by Andoh Parachemie Co., Ltd.) as a solvent was added, and mixed with a planetary centrifugal mixer (manufactured by Thinky Corporation, trade name: ARE-500) for 5 minutes to produce Adhesive 3.

(Adhesive 4)

To 100 parts by mass of a mixture consisting of 80% by mass (ratio of component (A) in component (A) and component (B)) of component (A) polyorganosiloxane and 20% by mass (ratio of component (B) in component (A) and component (B)) of component (B) polyorganosiloxane (manufactured by Wacker Chemie AG, trade name: AK1000000, viscosity: 1,000,000 mm$^2$/s), 30 parts by mass of Isoper-E (manufactured by Andoh Parachemie Co., Ltd.) as a solvent was added, and mixed with a planetary centrifugal mixer (manufactured by Thinky Corporation, trade name: ARE-500) for 5 minutes to produce Adhesive 4.

(Adhesive 5)

To 100 parts by mass of a mixture consisting of 70% by mass (ratio of component (A) in component (A) and component (B)) of component (A) polyorganosiloxane and 30% by mass (ratio of component (B) in component (A) and component (B)) of component (B) polyorganosiloxane (manufactured by Wacker Chemie AG, trade name: AK1000000, viscosity: 1,000,000 mm$^2$/s), 45 parts by mass of Isoper-E (manufactured by Andoh Parachemie Co., Ltd.) as a solvent was added, and mixed with a planetary centrifugal mixer (manufactured by Thinky Corporation, trade name: ARE-500) for 5 minutes to produce Adhesive 5.

(Adhesive 6)

To 100 parts by mass of a mixture consisting of 60% by mass (ratio of component (A) in component (A) and component (B)) of component (A) polyorganosiloxane and 40% by mass (ratio of component (B) in component (A) and component (B)) of component (B) polyorganosiloxane (manufactured by Wacker Chemie AG, trade name: AK1000000, viscosity: 1,000,000 mm$^2$/s), 60 parts by mass of Isoper-E (manufactured by Andoh Parachemie Co., Ltd.) as a solvent was added, and mixed with a planetary centrifugal mixer (manufactured by Thinky Corporation, trade name: ARE-500) for 5 minutes to produce Adhesive 6.

(Adhesive 7)

To 100 parts by mass of a mixture consisting of 50% by mass (ratio of component (A) in component (A) and component (B)) of component (A) polyorganosiloxane and 50% by mass (ratio of component (B) in component (A) and component (B)) of component (B) polyorganosiloxane (manufactured by Wacker Chemie AG, trade name: AK1000000, viscosity: 1,000,000 mm$^2$/s), 75 parts by mass of Isoper-E (manufactured by Andoh Parachemie Co., Ltd.) as a solvent was added, and mixed with a planetary centrifugal mixer (manufactured by Thinky Corporation, trade name: ARE-500) for 5 minutes to produce Adhesive 7.

(Adhesive 8)

To 100 parts by mass of a mixture consisting of 40% by mass (ratio of component (A) in component (A) and component (B)) of component (A) polyorganosiloxane and 60% by mass (ratio of component (B) in component (A) and component (B)) of component (B) polyorganosiloxane (manufactured by Wacker Chemie AG, trade name: AK1000000, viscosity: 1,000,000 mm$^2$/s), 90 parts by mass of Isoper-E (manufactured by Andoh Parachemie Co., Ltd.) as a solvent was added, and mixed with a planetary centrifugal mixer (manufactured by Thinky Corporation, trade name: ARE-500) for 5 minutes to produce Adhesive 8.

(Adhesive 9)

To 100 parts by mass of a mixture consisting of 30% by mass (ratio of component (A) in component (A) and component (B)) of component (A) polyorganosiloxane and 70% by mass (ratio of component (B) in component (A) and component (B)) of component (B) polyorganosiloxane (manufactured by Wacker Chemie AG, trade name: AK1000000, viscosity: 1,000,000 mm$^2$/s), 105 parts by mass of Isoper-E (manufactured by Andoh Parachemie Co., Ltd.) as a solvent was added, and mixed with a planetary centrifugal mixer (manufactured by Thinky Corporation, trade name: ARE-500) for 5 minutes to produce Adhesive 9.

(Adhesive 10)

To 100 parts by mass of a mixture consisting of 20% by mass (ratio of component (A) in component (A) and component (B)) of component (A) polyorganosiloxane and 80% by mass (ratio of component (B) in component (A) and component (B)) of component (B) polyorganosiloxane (manufactured by Wacker Chemie AG, trade name: AK1000000, viscosity: 1,000,000 mm$^2$/s), 120 parts by mass of Isoper-E (manufactured by Andoh Parachemie Co., Ltd.) as a solvent was added, and mixed with a planetary centrifugal mixer (manufactured by Thinky Corporation, trade name: ARE-500) for 5 minutes to produce Adhesive 10.

(Adhesive 11)

To 100 parts by mass of a mixture consisting of 10% by mass (ratio of component (A) in component (A) and component (B)) of component (A) polyorganosiloxane and 90% by mass (ratio of component (B) in component (A) and component (B)) of component (B) polyorganosiloxane (manufactured by Wacker Chemie AG, trade name: AK1000000, viscosity: 1,000,000 mm$^2$/s), 135 parts by mass of Isoper-E (manufactured by Andoh Parachemie Co., Ltd.) as a solvent was added, and mixed with a planetary centrifugal mixer (manufactured by Thinky Corporation, trade name: ARE-500) for 5 minutes to produce Adhesive 11.

(Adhesive 12)

To 100 parts by mass of a mixture consisting of 70% by mass (ratio of component (A) in component (A) and component (B)) of component (A) polyorganosiloxane and 30% by mass (ratio of component (B) in component (A) and component (B)) of component (B) polyorganosiloxane (manufactured by Wacker Chemie AG, trade name: AK300000, viscosity: 300,000 mm$^2$/s), 45 parts by mass of Isoper-E (manufactured by Andoh Parachemie Co., Ltd.) as a solvent was added, and mixed with a planetary centrifugal mixer (manufactured by Thinky Corporation, trade name: ARE-500) for 5 minutes to produce Adhesive 12.

(Adhesive 13)

To 100 parts by mass of a mixture consisting of 70% by mass (ratio of component (A) in component (A) and component (B)) of component (A) polyorganosiloxane and 30% by mass (ratio of component (B) in component (A) and component (B)) of component (B) polyorganosiloxane (manufactured by Wacker Chemie AG, trade name: AK100000, viscosity: 100,000 mm$^2$/s), 45 parts by mass of Isoper-E (manufactured by Andoh Parachemie Co., Ltd.) as a solvent was added, and mixed with a planetary centrifugal mixer (manufactured by Thinky Corporation, trade name: ARE-500) for 5 minutes to produce Adhesive 13.

(Adhesive 14)

To 100 parts by mass of a mixture consisting of 70% by mass (ratio of component (A) in component (A) and component (B)) of component (A) polyorganosiloxane and 30% by mass (ratio of component (B) in component (A) and component (B)) of component (B) polyorganosiloxane (manufactured by Wacker Chemie AG, trade name: AK60000, viscosity: 60,000 mm$^2$/s), 45 parts by mass of Isoper-E (manufactured by Andoh Parachemie Co., Ltd.) as a solvent was added, and mixed with a planetary centrifugal mixer (manufactured by Thinky Corporation, trade name: ARE-500) for 5 minutes to produce Adhesive 14.

(Adhesive 15)

To 100 parts by mass of a mixture consisting of 70% by mass (ratio of component (A) in component (A) and component (B)) of component (A) polyorganosiloxane and 30% by mass (ratio of component (B) in component (A) and component (B)) of component (B) polyorganosiloxane (manufactured by Wacker Chemie AG, trade name: AK10000, viscosity: 10,000 mm$^2$/s), 45 parts by mass of Isoper-E (manufactured by Andoh Parachemie Co., Ltd.) as a solvent was added, and mixed with a planetary centrifugal mixer (manufactured by Thinky Corporation, trade name: ARE-500) for 5 minutes to produce Adhesive 15.

(Adhesive 16)

To 100 parts by mass of a mixture consisting of 70% by mass (ratio of component (A) in component (A) and component (B)) of component (A) polyorganosiloxane and 30% by mass (ratio of component (B) in component (A) and component (B)) of component (B) polyorganosiloxane (manufactured by Wacker Chemie AG, trade name: AK1000, viscosity: 1,000 mm$^2$/s), 45 parts by mass of Isoper-E (manufactured by Andoh Parachemie Co., Ltd.) as a solvent was added, and mixed with a planetary centrifugal mixer (manufactured by Thinky Corporation, trade name: ARE-500) for 5 minutes to produce Adhesive 16.

(Adhesive 17)

Adhesive 17 consisting of only component (A) polyorganosiloxane was prepared.

Example 1

Each of Adhesives (1) to (11), and (17) was applied to the circuit-bearing face of a 300 mm silicon wafer (thickness: 770 μm) as a wafer on device side by a spin-coating for forming a temporary adhesion layer in a film-thickness of about 50 μm to form Adhesion layers (1) to (11) and (17), respectively. The wafer having a temporary adhesion layer and a 300 mm glass wafer (thickness: 700 μm) as a wafer (support) on carrier side were bonded by a vacuum lamination apparatus (manufactured by Suss Micro Tec AG, Manual Bonder) so as to sandwich the resin (the above-mentioned adhesive) to produce a laminate. Thereafter, heat treatment was performed on a hot plate at 190° C. for 10 minutes with the wafer on device side facing down. Thereafter, the presence or absence of void was confirmed from the glass wafer (support) side. The adhesiveness of a case where void was not observed after heat treatment was judged as good, and was indicated by "○", and the adhesiveness of a case where void was observed was judged as poor, and was indicated by "X". In addition, in order to confirm the peelability, the force required for peeling was measured with a peeling apparatus (manufactured by Suss Micro Tec AG, Manual Debonder). With respect to those that could be peeled off, as a good result, the force required for peeling was indicated by a numerical value, and those that could not be peeled off were indicated by "X" as defects. In addition, peeling interface was also confirmed when the peelability was confirmed. When peeling occurs at the interface between the wafer on device side and the adhesion layer and the peeling face could be selected, it was indicated by "Device", and when peeling occurs at the interface between the wafer (support) on carrier side and the adhesion layer and the peeling face could be selected, it was indicated by "Carrier", and the case where the peeling interface could not be selected was indicated by "Δ", the case where the cohesive failure occurred in the adhesive layer was indicated by "X", and the case where it could not be peeled off was indicated by "—". The results are shown in Table 1.

TABLE 1

(The results of Example 1)

| | Adhesiveness | Peelability | Peeling Interface |
|---|---|---|---|
| Adhesion layer (1) | ○ | X | — |
| Adhesion layer (2) | ○ | X | — |
| Adhesion layer (3) | ○ | X | — |
| Adhesion layer (4) | ○ | 35N | Device |
| Adhesion layer (5) | ○ | 21N | Device |
| Adhesion layer (6) | ○ | 19N | Device |
| Adhesion layer (7) | ○ | 18N | Device |
| Adhesion layer (8) | ○ | 21N | Δ |
| Adhesion layer (9) | ○ | 27N | Δ |
| Adhesion layer (10) | ○ | 32N | Δ |
| Adhesion layer (11) | ○ | 37N | X |
| Adhesion layer (17) | ○ | X | — |

The results of Table 1 relating to the laminates show that Adhesion layers (1) to (3) and (17) formed from Adhesives (1) to (3) and (17) exhibit good adhesiveness but poor peelability. On the other hand, Adhesion layers (4) to (7) formed from Adhesives (4) to (7) exhibit good adhesiveness, peelability and selectivity of peeling interface. Adhesion layers (8) to (11) formed from Adhesives (8) to (11) exhibit good adhesiveness and peelability, but they exhibit no good results in selectivity of peeling interface.

Example 2

Adhesive (5) was applied to the circuit-bearing face of a 300 mm silicon wafer (thickness: 770 μm) as a wafer on device side by a spin-coating for forming a temporary adhesion layer in a film-thickness of about 50 μm to form Adhesion layers (5-1) to (5-2), respectively. The wafer having an adhesion layer and a 300 mm silicon wafer (thickness: 770 μm) as a wafer (support) on carrier side were bonded by a vacuum lamination apparatus (manufactured by Suss Micro Tec AG, Manual Bonder) so as to sandwich the resin (the above-mentioned adhesive) to produce a laminate. Thereafter, heat treatment was performed on a hot plate at 190° C. for 10 minutes. The case where the heating treatment was performed with the wafer on device side facing down was indicated by "Device" (Adhesion layer (5-1)), while the case where the heating treatment was performed with the wafer (support) on carrier side facing down was indicated by "Carrier" (Adhesion layer (5-2)). In addition, in order to confirm the peelability, the force required for peeling was measured with a peeling apparatus (manufactured by Suss Micro Tec AG, Manual Debonder). With respect to those that could be peeled off, as a good result, the force required for peeling was indicated by a numerical value, and those that could not be peeled off were indicated by "X" as defects. In addition, peeling interface was also confirmed when the peelability was confirmed. When peeling occurs at the interface between the wafer on device side and the adhesion layer and the peeling face could be selected, it was indicated by "Device", and when peeling occurs at the interface between the wafer (support) on carrier side and the adhesion layer and the peeling face could be selected, it was indicated by "Carrier", and the case where the peeling interface could not be selected was indicated by "X". The results are shown in Table 2.

TABLE 2

(The results of Example 2)

| | Heated Face | Peelability | Peeling Interface |
|---|---|---|---|
| Adhesion layer (5-1) | Device | 23N | Device |
| Adhesion layer (5-2) | Carrier | 21N | Carrier |

The results of Table 2 relating to the laminates show that Adhesion layers (5-1) to (5-2) formed from Adhesive (5) exhibit good peelability and selectivity of peeling interface. Further, it was confirmed that peeling interface changes depending on the face to be heated on curing of the adhesive and thus peeling face can be completely selected.

Example 3

Adhesive (5) was applied to the circuit-bearing face of a 300 mm silicon wafer (thickness: 770 μm) as a wafer on device side by a spin-coating for forming a temporary adhesion layer in a film-thickness of about 50 μm to form Adhesion layers (5-3) to (5-4), respectively. The wafer having an adhesion layer and a 300 mm silicon wafer (thickness: 770 μm) as a wafer (support) on carrier side were bonded by a vacuum lamination apparatus (manufactured by Suss Micro Tec AG, Manual Bonder) so as to sandwich the resin (the above-mentioned adhesive) to produce a laminate. Thereafter, heat treatment was performed on an inert gas oven (manufactured by Espec Corp.) at 190° C. for 10 minutes. The case where the heating treatment was performed with the wafer on device side facing down was indicated by "Device" (Adhesion layer (5-3)), while the case where the heating treatment was performed with the wafer (support) on carrier side facing down was indicated by "Carrier" (Adhesion layer (5-4)). In addition, in order to confirm the peelability, the force required for peeling was measured with a peeling apparatus (manufactured by Suss Micro Tec AG, Manual Debonder). With respect to those that could be peeled off, as a good result, the force required for peeling was indicated by a numerical value, and those that could not be peeled off were indicated by "X" as defects. In addition, peeling interface was also confirmed when the peelability was confirmed. When peeling occurs at the interface between the wafer on device side and the adhesion layer and the peeling face could be selected, it was indicated by "Device", and when peeling occurs at the interface between the wafer (support) on carrier side and the adhesion layer and the peeling face could be favorably selected, it was indicated by "Carrier", and the case where the peeling interface could not be selected was indicated by "X". The results are shown in Table 3.

TABLE 3

(The results of Example 3)

|  | Heated Face | Peelability | Peeling Interface |
| --- | --- | --- | --- |
| Adhesion layer (5-3) | Device | 23N | X |
| Adhesion layer (5-4) | Carrier | 21N | X |

The results of Table 3 relating to the laminates show that Adhesion layers (5-3) to (5-4) formed from Adhesive (5) exhibit good peelability. However, the case where heat is applied uniformly to the laminate on the curing of the adhesive did not provide any good results on the selectivity of peeling interface.

Example 4

Adhesive (5) was applied to the circuit-bearing face of a 300 mm silicon wafer (thickness: 770 μm) as a wafer on device side by a spin-coating for forming a temporary adhesion layer in a film-thickness of about 50 μm to form Adhesion layers (5-5) to (5-8), respectively. The wafer having an adhesion layer and a 300 mm glass wafer (thickness: 700 μm) as a wafer (support) on carrier side were bonded by a vacuum lamination apparatus (manufactured by Suss Micro Tec AG, Manual Bonder) so as to sandwich the resin (the above-mentioned adhesive) to produce a laminate. Thereafter, heat treatment was performed on a hot plate at 190° C. for 10 minutes. The case where the heating treatment was performed with the wafer on device side facing down was indicated by "Device" (Adhesion layer (5-5)), while the case where the heating treatment was performed with the wafer (support) on carrier side facing down was indicated by "Carrier" (Adhesion layer (5-6)).

Further thereafter, as a heat resistance test, heat treatment was performed on a hot plate at 250° C. for 1 hour. The heat resistance test was performed with the wafer on device side facing down, and the case where defects such as void and the like were not observed was indicated by "Device" as good result (Adhesion layer (5-7)), and the heat resistance test was performed with the wafer (support) on carrier side facing down, and the case where defects such as void and the like were not observed was indicated by "Carrier" as good result (Adhesion layer (5-8)), and the case where the heat resistance test was not performed was indicated by "—". Thereafter, in order to confirm the peelability, the force required for peeling was measured with a peeling apparatus (manufactured by Suss Micro Tec AG, Manual Debonder). With respect to those that could be peeled off, as a good result, the force required for peeling was indicated by a numerical value, and those that could not be peeled off were indicated by "X" as defects. In addition, peeling interface was also confirmed when the peelability was confirmed. When peeling occurs at the interface between the wafer on device side and the adhesion layer and the peeling face could be selected, it was indicated by "Device", and when peeling occurs at the interface between the wafer (support) on carrier side and the adhesion layer and the peeling face could be selected, it was indicated by "Carrier", and the case where the peeling interface could not be selected was indicated by "X" as defects. The results are shown in Table 4.

TABLE 4

(The results of Example 4)

|  | Heated Face | Heat Resistance Test | Peelability | Peeling Interface |
| --- | --- | --- | --- | --- |
| Adhesion layer (5-5) | Device | — | 21N | Device |
| Adhesion layer (5-6) | Carrier | — | 20N | Carrier |
| Adhesion layer (5-7) | Device | Device | 21N | Device |
| Adhesion layer (5-8) | Device | Carrier | 18N | Device |

The results of Table 4 relating to the laminates show that Adhesion layers (5-5) to (5-6) formed from Adhesive (5) exhibit good peelability and that peeling face can be selected depending on the face to be heated on curing of the adhesive, even when a glass wafer is used as a wafer on carrier side.

Further, it was confirmed that Adhesion layers (5-7) to (5-8) formed from Adhesive (5) exhibit that peeling interface can be selected depending on the face to be heated on curing of the adhesive, even when the heating treatment of the wafer on device side was performed and then the heat resistance test was performed for the wafer on device side or the wafer (support) on carrier side.

Example 5

Adhesive (5) was applied to the circuit-bearing face of a Cu pillar 300 mm wafer (thickness: 770 μm, chip size: 10 mm, Cu pillar diameter: 40 μm, Cu pillar height: 25 μm, bump pitch: 100 μm) manufactured by Kiyokawa Plating Industry Co., Ltd. as a wafer on device side by a spin-coating for forming a temporary adhesion layer in a film-thickness of about 50 μm to form Adhesion layers (5-9) to (5-11), respectively. The wafer having an adhesion layer and a 300 mm silicon wafer (thickness: 770 μm) as a wafer (support) on carrier side were bonded by a vacuum lamination apparatus (manufactured by Suss Micro Tec AG, Manual Bonder) so as to sandwich the resin (the above-mentioned adhesive) to produce a laminate. Thereafter, heat treatment was performed on a hot plate at 190° C. for 10 minutes. The case where the heating treatment was performed with the wafer on device side facing down was indicated by "Device" (Adhesion layer (5-9)), while the case where the heating treatment was performed with the wafer (support) on carrier side facing down was indicated by "Carrier" (Adhesion layer (5-10)).

Further thereafter, as a heat resistance test, heat treatment was performed on an inert gas oven at 250° C. for 1 hour (Adhesion layer (5-11)). After the heat resistance, the case where defects such as void and the like were not observed was indicated by "○" as good result, and the case where defects such as void and the like were observed was indicated by "X" as poor result. The case where the heat resistance test was not performed was indicated by "—". Thereafter, in order to confirm the peelability, the force required for peeling was measured with a peeling apparatus (manufactured by Suss Micro Tec AG, Manual Debonder). With respect to those that could be peeled off, as a good result, the force required for peeling was indicated by a numerical value, and those that could not be peeled off were indicated by "X" as defects. In addition, peeling interface was also confirmed when the peelability was confirmed. When peeling occurs at the interface between the wafer on device side and the adhesion layer and the peeling face could be selected, it was indicated by "Device", and when peeling occurs at the interface between the wafer (support) on carrier side and the adhesion layer and the peeling face could be selected, it was indicated by "Carrier", and the case where the peeling interface could not be selected was indicated by "X" as defects. The results are shown in Table 5.

TABLE 5

(The results of Example 5)

| | Heated Face | Heat Resistance Test | Peelability | Peeling Interface |
|---|---|---|---|---|
| Adhesion layer (5-9) | Device | — | 23N | Device |
| Adhesion layer (5-10) | Carrier | — | 20N | Carrier |
| Adhesion layer (5-11) | Device | ○ | 25N | Device |

The results of Table 5 relating to the laminates show that Adhesion layers (5-9) to (5-10) formed from Adhesive (5) exhibit good peelability and that peeling face can be selected depending on the face to be heated on curing of the adhesive, even when the wafer on device side has a structure on the surface.

Further, it was confirmed that Adhesion layer (5-11) formed from Adhesive (5) exhibit that peeling interface can be selected depending on the face to be heated on curing of the adhesive, even when a glass wafer is used as a wafer on carrier side, even when the heating treatment of the wafer on device side was performed and then the heat resistance test was performed with an inert gas oven.

Example 6

Adhesive (5) was applied to the circuit-bearing face of each of several wafers as a wafer on device side, for example a 300 mm PI wafer (thickness: 770 μm, substrate: SiN+PI, scribe-line: width 100 mm, pitch 15 mm) manufactured by Global Net. Co., Ltd., a 300 mm glass wafer (thickness: 700 μm) manufactured by Corning Incorporated, and a 300 mm Cu pillar wafer (thickness: 770 μm, chip size: 25 mm, Cu pillar diameter: 75 μm, Cu pillar+SnAg capping height: 45 μm, Bump pitch: 150 μm) manufactured by Walts Co., Ltd., by a spin-coating for forming a temporary adhesion layer in a film-thickness of about 50 μm to form Adhesion layers (5-12) to (5-14), respectively. The wafer having an adhesion layer and a 300 mm silicon wafer (thickness: 770 μm) as a wafer (support) on carrier side were bonded by a vacuum lamination apparatus (manufactured by Suss Micro Tec AG, Manual Bonder) so as to sandwich the resin (the above-mentioned adhesive) to produce a laminate. Thereafter, heat treatment was performed on a hot plate with the wafer on device side facing down at 190° C. for 10 minutes.

Thereafter, in order to confirm the peelability, the force required for peeling was measured with a peeling apparatus (manufactured by Suss Micro Tec AG, Manual Debonder). With respect to those that could be peeled off, as a good result, the force required for peeling was indicated by a numerical value, and those that could not be peeled off were indicated by "X" as defects. In addition, peeling interface was also confirmed when the peelability was confirmed. When peeling occurs at the interface between the wafer on device side and the adhesion layer and the peeling face could be selected, it was indicated by "Device", and when peeling occurs at the interface between the wafer (support) on carrier side and the adhesion layer and the peeling face could be selected, it was indicated by "Carrier", and the case where the peeling interface could not be selected was indicated by "X" as defects. The results are shown in Table 6.

TABLE 6

(The results of Example 6)

| | Device Wafer | Peelability | Peeling Interface |
|---|---|---|---|
| Adhesion layer (5-12) | PI wafer | 23N | Device |
| Adhesion layer (5-13) | Glass | 20N | Device |
| Adhesion layer (5-14) | Cu pillar wafer | 25N | Device |

The results of Table 6 relating to the laminates show that Adhesion layers (5-12) to (5-14) formed from Adhesive (5) exhibit good peelability and that peeling interface can be selected depending on the face to be heated on curing of the adhesive, even when the wafer on device side has a structure on the surface.

Example 7

Adhesive (5) was applied to the circuit-bearing face of a 300 mm silicon wafer (thickness: 770 μm) as a wafer on device side by a spin-coating for forming a temporary adhesion layer in a film-thickness of about 30 μm or 70 μm to form Adhesion layers (5-15) to (5-16), respectively. The wafer having an adhesion layer and a 300 mm silicon wafer (thickness: 770 μm) as a wafer (support) on carrier side were bonded by a vacuum lamination apparatus (manufactured by Suss Micro Tec AG, Manual Bonder) so as to sandwich the resin (the above-mentioned adhesive) to produce a laminate. Thereafter, heat treatment was performed on a hot plate with the wafer on device side facing down at 190° C. for 10 minutes.

Thereafter, in order to confirm the peelability, the force required for peeling was measured with a peeling apparatus (manufactured by Suss Micro Tec AG, Manual Debonder). With respect to those that could be peeled off, as a good result, the force required for peeling was indicated by a numerical value, and those that could not be peeled off were indicated by "X" as defects. In addition, peeling interface was also confirmed when the peelability was confirmed. When peeling occurs at the interface between the wafer on device side and the adhesion layer and the peeling face could be selected, it was indicated by "Device", and when peeling occurs at the interface between the wafer (support) on carrier side and the adhesion layer and the peeling face could be selected, it was indicated by "Carrier", and the case where the peeling interface could not be selected was indicated by "X" as defects. The results are shown in Table 7.

TABLE 7

(The results of Example 7)

| | Film-thickness of Adhesive Layer | Peelability | Peeling Interface |
|---|---|---|---|
| Adhesion layer (5-15) | 30 μm | 24N | Device |
| Adhesion layer (5-16) | 70 μm | 24N | Device |

The results of Table 7 relating to the laminates show that Adhesion layers (5-15) to (5-16) formed from Adhesive (5) exhibit good peelability regardless of film thickness of adhesion layer and that peeling interface can be selected depending on the face to be heated on curing of the adhesive.

Example 8

Adhesive (5) was applied to the circuit-bearing face of a 300 mm silicon wafer (thickness: 770 μm) as a wafer on device side by a spin-coating for forming a temporary adhesion layer in a film-thickness of about 50 μm to form Adhesion layers (5-17) to (5-22), respectively. The wafer having an adhesion layer and a 300 mm silicon wafer (thickness: 770 μm) as a wafer (support) on carrier side were bonded by a vacuum lamination apparatus (manufactured by Suss Micro Tec AG, Manual Bonder) so as to sandwich the resin (the above-mentioned adhesive) to produce a laminate. Thereafter, heat treatment was performed on a hot plate with the wafer on device side facing down at 120 to 260° C. for 10 minutes. In the heat treatment, the temperature of the wafer on carrier side (upper side) was measured 9 minutes after the start of the heat treatment with a thermocouple thermometer (manufactured by As One Corporation). The heat treatment for comparison was performed at 190° C. for 10 minutes with an inert gas oven.

Thereafter, in order to confirm the peelability, the force required for peeling was measured with a peeling apparatus (manufactured by Suss Micro Tec AG, Manual Debonder). With respect to those that could be peeled off, as a good result, the force required for peeling was indicated by a numerical value, and those that could not be peeled off were indicated by "X" as defects. In addition, peeling interface was also confirmed when the peelability was confirmed. When peeling occurs at the interface between the wafer on device side and the adhesion layer and the peeling face could be selected, it was indicated by "Device", and when peeling occurs at the interface between the wafer (support) on carrier side and the adhesion layer and the peeling interface could be selected, it was indicated by "Carrier", and the case where the peeling face could not be selected was indicated by "X". The results are shown in Table 8.

TABLE 8

(The results of Example 8)

|  | A* | B* | C* | D* | E* |
|---|---|---|---|---|---|
| Adhesion layer (5-17) | Hot plate | 120° C. | 116.9° C. | 19N | Device |
| Adhesion layer (5-18) | Hot plate | 150° C. | 144.9° C. | 21N | Device |
| Adhesion layer (5-19) | Hot plate | 190° C. | 183.6° C. | 19N | Device |
| Adhesion layer (5-20) | Hot plate | 220° C. | 213.7° C. | 20N | Device |
| Adhesion layer (5-21) | Hot plate | 260° C. | 252.7° C. | 20N | Device |
| Adhesion layer (5-22) | Oven | 190° C. | — | 23N | X |

*A: Apparatus for heat treatment, B: Temperature for heat treatment, C: Carrier temperature, D: Peelability, E: Peeling interface The results of Table 8 relating to the laminates show that Adhesion layers (5-17) to (5-22) formed from Adhesive (5) exhibit good peelability regardless of temperature for heat treatment and that peeling interface can be selected depending on the face to be heated on curing of the adhesive when the heat treatment was performed with a hot plate. On the other hand, when the heat treatment was performed with an inert gas oven, peeling interface could not be selected. The temperature difference between the hot plate at the heat treatment and the wafer (support) on carrier side was 3.1 to 7.3° C. It is considered that this temperature difference is related to the selectivity of the peeling interface.

Example 9

Each of Adhesives (5) and (12) to (16) was applied to the circuit-bearing face of a 300 mm silicon wafer (thickness: 770 μm) as a wafer on device side by a spin-coating for forming a temporary adhesion layer in a film-thickness of about 50 μm to form Adhesion layers (5-23), and (12) to (16), respectively. The wafer having an adhesion layer and a 300 mm glass wafer (thickness: 700 μm) as a wafer (support) on carrier side were bonded by a vacuum lamination apparatus (manufactured by Suss Micro Tec AG, Manual Bonder) so as to sandwich the resin (the above-mentioned adhesive) to produce a laminate. Thereafter, heat treatment was performed on a hot plate with the wafer on device side facing down at 190° C. for 10 minutes. Thereafter, the presence or absence of void was confirmed from the glass wafer side. The adhesiveness of a case where void was not observed after heat treatment was judged as good, and was indicated by "○", and the adhesiveness of a case where void was observed was judged as poor, and was indicated by "X". In addition, in order to confirm the peelability, the force required for peeling was measured with a peeling apparatus (manufactured by Suss Micro Tec AG, Manual Debonder). With respect to those that could be peeled off, as a good result, the force required for peeling was indicated by a numerical value, and those that could not be peeled off were indicated by "X" as defects. In addition, peeling interface was also confirmed when the peelability was confirmed. When peeling occurs at the interface between the wafer on device side and the adhesion layer and the peeling face could be selected, it was indicated by "Device", and when peeling occurs at the interface between the wafer (support) on carrier side and the adhesion layer and the peeling face could be selected, it was indicated by "Carrier", the case where the peeling interface could not be selected was indicated by "Δ", the case where cohesive failures occurred in the adhesive layer was indicated by "X", and the case where it could not be peeled off was indicated by "—". The results are shown in Table 9.

TABLE 9

(The results of Example 9)

|  | Adhesiveness | Peelability | Peeling Interface |
|---|---|---|---|
| Adhesion layer (5-23) | ○ | 21N | Device |
| Adhesion layer (12) | ○ | 21N | Device |
| Adhesion layer (13) | ○ | 25N | Device |
| Adhesion layer (14) | ○ | 28N | Device |
| Adhesion layer (15) | ○ | 40N | Device |
| Adhesion layer (16) | ○ | — | — |

The results of Table 9 relating to the laminates show that Adhesion layers (5-23) and (12) to (15) formed from Adhesive (5) and (12) to (15) respectively exhibit good adhesiveness and peelability, further, it was confirmed that peeling interface can be selected depending on the face to be heated on curing of the adhesive. The case where Adhesive (16) was used was difficult to peel off.

Example 10

Adhesive (5) was applied to the circuit-bearing face of a 300 mm trim silicon wafer (thickness: 770 μm) as a wafer on device side by a spin-coating for forming a temporary adhesion layer in a film-thickness of about 50 μm to form Adhesion layer (5-24). The wafer having an adhesion layer and a 300 mm silicon wafer (thickness: 770 μm) as a wafer (support) on carrier side were bonded by a vacuum lamination apparatus (manufactured by Suss Micro Tec AG, Manual Bonder) so as to sandwich the resin (the above-mentioned adhesive) to produce a laminate. Thereafter, heat treatment was performed on a hot plate with the wafer on device side facing down at 190° C. for 10 minutes. Thereafter, the thinning treatment of the wafer on device side was performed with a back face grinding apparatus (manufactured by Tokyo Seimitsu Co., Ltd., back grinder). The edge of the wafer on device side after thinning treatment was observed with an optical microscope, the case where no chipping was observed was indicated by "○" as a good result, and the case where chipping was observed was indicated by "X". The results are shown in Table 10.

TABLE 10

(The results of Example 10)

|  | Chipping |
|---|---|
| Adhesion layer (5-24) | ○ |

The results of Table 10 relating to the laminates show that Adhesion layer (5-24) formed from Adhesive (5) exhibits good results as no chipping was confirmed in the thinning treatment step.

Example 11: Regeneration Test of Carrier Wafer (Support) with Solvent

Adhesive (5) was applied to the circuit-bearing face of a 300 mm trim silicon wafer (thickness: 770 μm) as a wafer on device side by a spin-coating for forming a temporary adhesion layer in a film-thickness of about 50 μm to form Adhesion layer (5-25). The wafer having an adhesion layer and a 300 mm silicon wafer (thickness: 770 μm) as a wafer (support) on carrier side were bonded by a vacuum lamination apparatus (manufactured by Suss Micro Tec AG, Manual Bonder) so as to sandwich the resin (the above-mentioned adhesive) to produce a laminate. Thereafter, heat treatment was performed on a hot plate with the wafer on device side facing down at 190° C. for 10 minutes. In addition, in order to confirm the peelability, peeling at the interface between the wafer on device side and Adhesion layer (5-25) was performed with a peeling apparatus (manufactured by Suss Micro Tec AG, Manual Debonder).

On the other hand, for comparison, Adhesive (17) composed of only component (A) was applied to a 300 mm silicon wafer (thickness: 770 μm) as wafer (support) on carrier side in a film-thickness of about 50 μm to form Adhesion layer (17). Thereafter, heat treatment was performed at 190° C. for 10 minutes.

Thereafter, Adhesion layers (5-25) and (17) remaining on the wafer (support) on carrier side were immersed in Isoper-E (Andoh Parachemie Co., Ltd.). The removal by liftoff was performed. The case where the adhesion layer was lifted off immediately after the immersion in the solvent was evaluated as good and indicated by "○", while the case where the adhesion layer was not lifted off was indicated by "X",

TABLE 11

(The results of Example 11)

|  | Liftoff |
|---|---|
| Adhesion layer (5-25) | ○ |
| Adhesion layer (17) | X |

The results of Table 11 relating to the laminates show that in Adhesion layer (5-25) formed from Adhesive (5), the adhesion layer was removed in the liftoff step, and thus exhibited good results. On the other hand, in Adhesion layer (17) formed from Adhesive (17), no liftoff could be confirmed.

Example 12: Regeneration Test of Carrier Wafer (Support) with Tape-Peeling

Adhesive (5) was applied to the circuit-bearing face of a 300 mm trim silicon wafer (thickness: 770 μm) as a wafer on device side by a spin-coating for forming a temporary adhesion layer in a film-thickness of about 50 μm to form Adhesion layers (5-26) and (5-27), respectively.

The wafer having a temporaty adhesion layer and a 300 mm silicon wafer (thickness: 770 μm) as a wafer (support) on carrier side were bonded by a vacuum lamination apparatus (manufactured by Suss Micro Tec AG, Manual Bonder) so as to sandwich the resin (the above-mentioned adhesive) to produce a laminate. Thereafter, heat treatment was performed on a hot plate with the wafer on device side facing down at 190° C. for 10 minutes. In addition, in order to confirm the peelability, peeling at the interface between the wafer on device side and Adhesion layer (5-26) or (5-27) was performed with a peeling apparatus (manufactured by Suss Micro Tec AG, Manual Debonder).

On the other hand, for comparison, Adhesive (17) composed of only component (A) was applied to a 300 mm silicon wafer (thickness: 770 μm) as wafer (support) on carrier side in a film-thickness of about 50 μm to form Adhesion layer (17-1) and (17-2), respectively. Thereafter, heat treatment was performed at 190° C. for 10 minutes.

Thereafter, Adhesion layer (5-26) to (5-27) and (17-1) and (17-2) remaining on the wafer (support) on carrier side were subjected to peeling test of adhesive in accordance with tape-peeling method with a tape for masking terminals during plating of printed circuit boards (manufactured by Nitto Denko Corporation, trade name: N-300), and a peeling tape (manufactured by Microcontrol Electronic SRL, trade name: DLO 330MA), respectively. The test of removing Adhesion layers (5-26) to (5-27), and (17-1) to (17-2) from the wafer (support) on carrier side was performed by adhering the above-mentioned tape to the surface of the adhesive on the wafer (support) on carrier side, and peeling off it at an angle of the range of 60 to 180°.

The case where the adhesive could be removed was evaluated as good and indicated by "○", while the case where the adhesive could not be removed was indicated by "X",

TABLE 12

(The results of Example 12)

|  | Tape | Tape-peeling test |
|---|---|---|
| Adhesion layer (5-26) | N-300 | ○ |
| Adhesion layer (5-27) | DLO330MA | ○ |
| Adhesion layer (17-1) | N-300 | X |
| Adhesion layer (17-2) | DLO330MA | X |

The results of Table 12 relating to the laminates show that in Adhesion layers (5-26) to (5-27) formed from Adhesive (5), the adhesion layer was removed in the liftoff step with the above-mentioned two tapes, and thus exhibited good results. On the other hand, in Adhesion layer (17-1) to (17-2)

composed of only component (A), the removal of the adhesion layer was not confired in the liftoff step.

Example 13: Cleaning Test of Device Wafer

Adhesive (5) was applied to the circuit-bearing face of a 300 mm trim silicon wafer (thickness: 770 μm) as a wafer on device side by a spin-coating for forming a temporary adhesion layer in a film-thickness of about 50 μm to form Adhesion layer (5-28). The wafer having an adhesion layer and a 300 mm silicon wafer (thickness: 770 μm) as a wafer (support) on carrier side were bonded by a vacuum lamination apparatus (manufactured by Suss Micro Tec AG, Manual Bonder) so as to sandwich the resin (the above-mentioned adhesive) to produce a laminate. Thereafter, heat treatment was performed on a hot plate with the wafer on device side facing down at 190° C. for 10 minutes. In addition, in order to confirm the peelability, peeling at the interface between the wafer on device side and Adhesion layer (5-28) was performed with a peeling apparatus (manufactured by Suss Micro Tec AG, Manual Debonder). In this case, most of the adhesive layer remains on the carrier side, and in order to remove the adhesive which is very slightly remaining on the device side wafer, paddle cleaning with a cleaner comprising tetrabutylammonium fluoride, DBU (di-azabicycloundecene), and 2-heptanone was performed for 10 minutes. Thereafter, the surface was observed with an optical microscope, the case where the temporary adhesive was completely removed was evaluated as good and indicated by "○", and the case where it could not be removed was indicated by "X".

TABLE 13

(The results of Example 13)

| | Cleaning test |
|---|---|
| Adhesion layer (5-28) | ○ |

The results of Table 13 relating to the laminates show that in Adhesion layer (5-28) formed from Adhesive (5), the surface of the wafer on device side was completely cleaned with the paddle cleaning by use of the above-mentioned cleaner, and thus exhibited good results.

INDUSTRIAL APPLICABILITY

The present invention provides an adhesive for forming an adhesion layer between a support (support substrate) and a wafer, wherein the adhesive comprises a polyorganosiloxane component curing by hydrosilylation reaction and a non-reactive polyorganosiloxane component, and enables selection of a peeled part depending on the heating direction at the time of curing with heating. As the selection of peeling interface can be selected, thinning step of the back face of wafers can be effectively carried out.

The invention claimed is:

1. An adhesive forming a cured adhesion layer for peelably adhering between a surface of a support and a circuit-bearing face of a wafer in a laminate consisting of the support, the cured adhesion layer and the wafer and thereby permitting processing of a back face of the wafer,
wherein the adhesive comprises a component (A) curing by hydrosilylation reaction and a component (B) containing a polydimethylsiloxane,
wherein the component (B) consists of a siloxane unit (D unit) represented by $R^4R^5SiO_{2/2}$, optionally with one or more of a siloxane unit (Q unit) represented by $SiO_2$, a siloxane unit (M unit) represented by $R^1R^2R^3SiO_{1/2}$, and a siloxane unit (T unit) represented by $R^6SiO_{3/2}$, wherein $R^4$ and $R^5$ are each methyl group, wherein $R^1$ to $R^3$ and $R^6$ independently of one another are a monovalent chemical group which is a $C_{1-10}$ alkyl group, a $C_{2-10}$ alkenyl group, or a hydrogen atom, and wherein each of $R^1$ to $R^6$ is bonded to a silicon atom through Si—C bond or Si—H bond,
wherein the cured adhesion layer is formed by curing an adhesion layer,
wherein the adhesion layer is formed by applying the adhesive to either the surface of the support or the circuit-bearing face of the wafer, and
wherein a peeling face for subsequent peeling is set to be an interface between the cured adhesion layer and the support by heating from the support side to cure the adhesion layer or is set to be an interface between the cured adhesion layer and the circuit-bearing face of the wafer by heating from the wafer side to cure the adhesion layer.

2. The adhesive according to claim 1, wherein the processing is a polishing of the back face of the wafer.

3. An adhesive forming a cured adhesion layer for bonding a surface of a support and a circuit-bearing face of a wafer in a laminate consisting of the support, the cured adhesion layer and the wafer, enabling a temporal adhesion by the cured adhesion layer for processing of a back face of the wafer, and enabling a selection of a peeling face as either between the support and the cured adhesion layer or between the wafer and the cured adhesion layer according to heating and curing an adhesion layer formed from the adhesive either from the support side or from the wafer side to cure the adhesion layer into the cured adhesion layer,
wherein the adhesive comprises a component (A) curing by hydrosilylation reaction and a component (B) containing a polydimethylsiloxane,
wherein the component (B) consists of a siloxane unit (D unit) represented by $R^4R^5SiO_{2/2}$, optionally with one or more of a siloxane unit (Q unit) represented by $SiO_2$, a siloxane unit (M unit) represented by $R^1R^2R^3SiO_{1/2}$, and a siloxane unit (T unit) represented by $R^6SiO_{3/2}$, wherein $R^4$ and $R^5$ are each methyl group, wherein $R^1$ to $R^3$ and $R^6$ independently of one another are a monovalent chemical group which is a $C_{1-10}$ alkyl group, a $C_{2-10}$ alkenyl group, or a hydrogen atom, and wherein each of $R^1$ to $R^6$ is bonded to a silicon atom through Si—C bond or Si—H bond,
wherein the cured adhesion layer is formed by curing the adhesion layer, and
wherein the adhesion layer is formed by applying the adhesive to either the surface of the support or the circuit-bearing face of the wafer.

4. The adhesive according to claim 3, wherein the component (A) contains
a polysiloxane (A1) selected from the group consisting of the siloxane unit (Q unit) represented by $SiO_2$, the siloxane unit (M unit) represented by $R^1R^2R^3SiO_{1/2}$, the siloxane unit (D unit) represented by $R^4R^5SiO_{2/2}$, the siloxane unit (T unit) represented by $R^6SiO_{3/2}$, and a combination thereof, (wherein $R^1$ to $R^6$ independently of one another are a mono-valent chemical group which is a $C_{1-10}$ alkyl group, a $C_{2-10}$ alkenyl group, or a hydrogen atom, with a proviso that each of $R^1$ to $R^6$ is bonded to a silicon atom through Si—C bond or Si—H bond, and a platinum group metal-based catalyst (A2), wherein the polysiloxane (A1) contains a polyorganosiloxane (a1) wherein the polyorganosiloxane (a1) is selected from the group consisting of a siloxane unit (Q unit) represented by $SiO_2$, a siloxane unit (M' unit) represented by $R^{1'}R^{2'}R^{3'}SiO_{1/2}$, a siloxane unit (D' unit) represented by $R^{4'}R^{5'}SiO_{2/2}$, a siloxane unit (T' unit) represented by $R^{6'}SiO_{3/2}$, and a combination thereof, wherein $R^{1'}$ to $R^{6'}$ independently of one another are a mono-valent chemical group which is a $C_{1-10}$ alkyl group, or a $C_{2-10}$ alkenyl group, and a polyorganosiloxane (a2) wherein the polyorganosiloxane (a2) is selected from the group consisting of a siloxane unit (Q unit) represented by $SiO_2$, a siloxane unit (M" unit) represented by $R^{1''}R^{2''}R^{3''}SiO_{1/2}$, a siloxane unit (D" unit) represented by $R^{4''}R^{5''}SiO_{2/2}$, a siloxane unit (T" unit) represented by $R^{6''}SiO_{3/2}$, and a combination thereof wherein $R^{1''}$ to $R^{6''}$ independently of one another are a mono-valent chemical group which is a $C_{1-10}$ alkyl group, or a hydrogen atom.

5. The adhesive according to claim 3, wherein the component (B) is a polydimethylsiloxane having a viscosity of 1,100 mm²/s to 2,000,000 mm²/s.

6. The adhesive according to claim 3, wherein the component (B) is a polydimethylsiloxane having a viscosity of 10,000 mm²/s to 1,000,000 mm²/s.

7. The adhesive according to claim 3, wherein the component (A) and the component (B) is contained in a ratio of 80:20 to 50:50 in % by mass in the adhesive.

8. The adhesive according to claim 3, further comprising an inhibitor (A3).

9. A forming method of a laminate comprising the steps:
a first step of forming an adhesion layer by applying an adhesive to a surface of a first substrate;
a second step of bonding a surface of a second substrate to the adhesion layer; and
a third step of curing the adhesion layer into a cured adhesion layer by heating from the first substrate side,
wherein the heating in the third step is carried out with a hotplate, a temperature of the first substrate is 120 to 260° C., and a temperature difference between the first substrate and the second substrate is 2 to 20° C.

10. The forming method according to claim 9, wherein the first substrate is a support, the second substrate is a wafer, and a circuit-bearing face of the wafer faces the first substrate in the second step.

11. The forming method according to claim 9, wherein the first substrate is a wafer, the second substrate is a support, and a circuit-bearing face of the wafer faces the second substrate in the second step.

12. The forming method according to claim 9, wherein the heating in the third step is carried out at 120 to 260° C. with a hot plate.

13. A peeling method comprising the steps:
a first step of forming an adhesion layer by applying an adhesive to a surface of a first substrate;
a second step of bonding a surface of a second substrate to the adhesion layer;
a third step of curing the adhesion layer into a cured adhesion layer by heating from the first substrate side to form a laminate;
a fourth step of processing the laminate; and
a fifth step of peeling off between the first substrate and the cured adhesion layer,
wherein the heating in the third step is carried out with a hotplate, a temperature of the first substrate is 120 to 260° C., and a temperature difference between the first substrate and the second substrate is 2 to 20° C.

14. The peeling method according to claim 13, wherein the first substrate is a support, the second substrate is a wafer, and a circuit-bearing face of the wafer faces the first substrate in the second step.

15. The peeling method according to claim 13, wherein the first substrate is a wafer, the second substrate is a support, and a circuit-bearing face of the wafer faces the second substrate in the second step.

16. The peeling method according to claim 13, wherein the processing in the fourth step is a polishing of a back face of the first substrate or the second substrate.

17. A peeling method comprising the steps:
a first step of forming an adhesion layer by applying an adhesive to a surface of a first substrate;
a second step of bonding a surface of a second substrate to the adhesion layer;
a third step of curing the adhesion layer into a cured adhesion layer by heating from the first substrate side to form a laminate;
a fourth step of processing the laminate; and
a fifth step of peeling off between the first substrate and the cured adhesion layer, wherein after peeling off between the first substrate and the cured adhesion layer, the second substrate and the cured adhesion layer are further separated, and
wherein the separation of the second substrate and the cured adhesion layer is carried out by adhering a tape to a surface of the cured adhesive and peeling off at an angle of 60° to 180° to a face of the second substrate.

18. A processing method of a laminate comprising the steps:
forming a laminate according to the method of claim 9; and
polishing a back face of the first substrate or the second substrate and then peeling off between the first substrate and the cured adhesion layer.

* * * * *